US010379635B2

(12) United States Patent
Wang et al.

(10) Patent No.: US 10,379,635 B2
(45) Date of Patent: Aug. 13, 2019

(54) POINTING DEVICE

(71) Applicant: CONTOUR DESIGN, INC., Windham, NH (US)

(72) Inventors: Steven Wang, Windham, NH (US); Leslie Scenna, Wilton, NH (US)

(73) Assignee: CONTOUR DESIGN, INC., Windham, NH (US)

( * ) Notice: Subject to any disclaimer, the term of this patent is extended or adjusted under 35 U.S.C. 154(b) by 0 days.

(21) Appl. No.: 14/765,530

(22) PCT Filed: Feb. 5, 2014

(86) PCT No.: PCT/EP2014/052275
§ 371 (c)(1),
(2) Date: Aug. 3, 2015

(87) PCT Pub. No.: WO2014/122191
PCT Pub. Date: Aug. 14, 2014

(65) Prior Publication Data
US 2015/0363014 A1 Dec. 17, 2015

(30) Foreign Application Priority Data
Feb. 5, 2013 (SE) ...................................... 1350139

(51) Int. Cl.
*G06F 3/01* (2006.01)
*G06F 3/0354* (2013.01)
(Continued)

(52) U.S. Cl.
CPC .......... *G06F 3/03548* (2013.01); *G06F 3/016* (2013.01); *G06F 3/038* (2013.01);
(Continued)

(58) Field of Classification Search
CPC ..................................................... H03K 17/97
See application file for complete search history.

(56) References Cited

U.S. PATENT DOCUMENTS 4,543,571 A  9/1985  Bilbrey et al.
4,544,915 A  10/1985  Wieme et al.
(Continued)

FOREIGN PATENT DOCUMENTS

CN    202110495 U    1/2012
CN    202306462 U    7/2012
(Continued)

OTHER PUBLICATIONS

"Ergonomic Equipment Can Take Away the Strain in Everyday Tasks," New York Times, Late Edition (East Coat), Nov. 15, 2001, 2 pages.
(Continued)

*Primary Examiner* — Carolyn R Edwards
(74) *Attorney, Agent, or Firm* — Lando & Anastasi, LLP

(57) ABSTRACT

A pointing device (200) for controlling a computer user interface is presented. The pointing device has a housing (210) with a base part (212). It also has an elongate support member (12) and an elongate cursor navigation member (14), the cursor navigation member being movably arranged for rotation about the support member and translation along the support member, the cursor navigation member further being depressible with respect to the base part. A plurality of sensors (602, 604, 610) for detecting rotation, translation and depression of the cursor navigation member is provided, as is computer interface circuitry (608) for connection to a computer. A controller (606) is connected to the plurality of sensors, the controller being configured to cause transmission of data regarding rotation, translation and depression of the cursor navigation member to the computer through the computer interface circuitry. The plurality of sensors include contactless click sensors (610) for detecting deflection of the support member (12) caused when a user depresses the cursor navigation member. The controller is configured to
(Continued)

monitor the outputs from the contactless click sensors to detect that the detected deflection exceeds a click operation threshold value, and in response determine that a mouse click operation is intended by the user's depression and cause transmission of data representing the mouse click operation to the computer through the computer interface circuitry. The controller has a click sensitivity adjustment mode for allowing the user to configure the click operation threshold value.

21 Claims, 11 Drawing Sheets

(51) Int. Cl.
    *G06F 3/038*           (2013.01)
    *H03K 17/97*          (2006.01)
    *G06F 3/0362*         (2013.01)
    *G06F 3/16*            (2006.01)

(52) U.S. Cl.
    CPC ............ *G06F 3/0362* (2013.01); *G06F 3/167* (2013.01); *H03K 17/97* (2013.01)

(56) References Cited

U.S. PATENT DOCUMENTS

| | | | |
|---|---|---|---|
| 4,692,756 A | 9/1987 | Clark | |
| 4,712,101 A | 12/1987 | Culver | |
| 4,724,715 A | 2/1988 | Culver | |
| 4,799,049 A | 1/1989 | Avila | |
| 4,928,093 A | 5/1990 | Rahman | |
| 4,982,618 A | 1/1991 | Culver | |
| 5,115,231 A | 5/1992 | Avila et al. | |
| 5,126,723 A | 6/1992 | Long et al. | |
| 5,164,712 A | 11/1992 | Niitsuma | |
| 5,222,136 A * | 6/1993 | Rasmussen | H04L 9/0625 380/266 |
| 5,600,348 A * | 2/1997 | Bartholow | G06F 3/03542 345/179 |
| 5,635,926 A | 6/1997 | Li | |
| 5,666,138 A | 9/1997 | Culver | |
| 5,703,356 A | 12/1997 | Bidiville et al. | |
| 5,818,427 A | 10/1998 | Stromberg | |
| 6,018,334 A | 1/2000 | Eckerberg et al. | |
| 6,020,877 A | 2/2000 | Smith | |
| 6,040,977 A | 3/2000 | Hoffer | |
| 6,046,728 A | 4/2000 | Hume et al. | |
| 6,084,574 A | 7/2000 | Bidiville | |
| 6,091,401 A | 7/2000 | Chen et al. | |
| 6,208,133 B1 * | 3/2001 | Ehling | G01B 7/003 324/202 |
| 6,300,938 B1 | 10/2001 | Culver | |
| 6,337,680 B1 | 1/2002 | Hamaji | |
| 7,199,792 B2 | 4/2007 | Wang | |
| 7,215,320 B2 * | 5/2007 | Takeuchi | G06F 3/016 345/156 |
| 7,973,767 B2 * | 7/2011 | Pedrazzini | G06F 3/0383 345/156 |
| 8,363,019 B2 * | 1/2013 | Cho | G06F 3/04883 345/173 |
| 8,830,166 B2 | 9/2014 | Nien et al. | |
| 9,013,426 B2 * | 4/2015 | Cole | G06F 3/016 345/173 |
| 9,024,873 B2 * | 5/2015 | Nien | G06F 3/0312 345/156 |
| 9,086,743 B2 | 7/2015 | Wang et al. | |
| 9,092,072 B2 | 7/2015 | Wang et al. | |
| 9,317,123 B2 * | 4/2016 | Provancher | G06F 3/016 |
| 9,430,064 B2 | 8/2016 | Wang et al. | |
| 9,436,299 B2 | 9/2016 | Wang et al. | |
| 9,477,322 B2 * | 10/2016 | Noris | G06F 3/0219 |
| 9,489,064 B2 | 11/2016 | Wang et al. | |
| 2001/0019324 A1 | 9/2001 | Rosenberg | |
| 2002/0126025 A1 | 9/2002 | Wang | |
| 2007/0097073 A1 | 5/2007 | Takashima et al. | |
| 2007/0113681 A1 * | 5/2007 | Nishimura | G06F 3/0414 73/862.046 |
| 2008/0278444 A1 | 11/2008 | Schelling et al. | |
| 2009/0256817 A1 * | 10/2009 | Perlin | G06F 3/0233 345/174 |
| 2011/0018798 A1 | 1/2011 | Chiang | |
| 2011/0037693 A1 | 2/2011 | Chiang | |
| 2011/0038114 A1 | 2/2011 | Pance et al. | |
| 2011/0134031 A1 | 6/2011 | Wang et al. | |
| 2011/0141052 A1 | 6/2011 | Bernstein et al. | |
| 2011/0199306 A1 | 8/2011 | Pan | |
| 2012/0038674 A1 * | 2/2012 | Stergiou | G06F 3/0213 345/650 |
| 2012/0063114 A1 | 3/2012 | Pan et al. | |
| 2012/0162070 A1 | 6/2012 | Nien et al. | |
| 2012/0228111 A1 | 9/2012 | Peterson et al. | |
| 2013/0033420 A1 | 2/2013 | Nien et al. | |
| 2013/0142362 A1 * | 6/2013 | Lynn | G06F 3/041 381/109 |
| 2017/0052607 A1 | 2/2017 | Wang et al. | |

FOREIGN PATENT DOCUMENTS

| | | |
|---|---|---|
| DK | 201570565 A1 | 8/2015 |
| DK | 201570486 A1 | 11/2016 |
| EP | 0382350 A2 | 8/1990 |
| EP | 0992936 A2 | 4/2000 |
| EP | 2226705 A2 | 9/2010 |
| EP | 2249232 A2 | 11/2010 |
| EP | 2485123 A1 | 8/2012 |
| JP | 2000047812 A | 2/2000 |
| JP | 2000132331 A | 5/2000 |
| JP | 2006023915 A | 1/2006 |
| SE | 1551082 A1 | 9/2015 |
| SE | 1551035 A1 | 12/2016 |
| TW | M364911 U | 9/2009 |
| TW | M414614 U | 10/2011 |
| TW | M422108 U | 2/2012 |
| WO | 200206943 A1 | 1/2002 |
| WO | 0243049 A1 | 5/2002 |
| WO | 200243046 A1 | 5/2002 |
| WO | 03038800 A1 | 5/2003 |
| WO | 2011070522 A2 | 6/2011 |
| WO | 2012032480 A1 | 3/2012 |

OTHER PUBLICATIONS

"On a Roll," Call Center Magazine, vol. 15, No. 11, Nov. 2002, pp. 10-12.
"Product News," ISHN vol. 43, No. 7, Jul. 2009, p. 43.
"Spotlight Best Practices," Professional Safety, vol. 53, No. 7, Jul. 2008, 9 pages.
"This Ain't No Palindrome," Call Center Magazine, vol. 16, No. 2, pp. 14-26, Feb. 2003.
Berger, "Rolling Away From Pain," Macworld, vol. 20, No. 9, Jun. 2003, 5 pages.
International Search Report for corresponding International Application No. PCT/IB2010/055667, dated May 25, 2011, 3 pages.
Shaw, Keith, "Cool Tools," Network World, vol. 18, No. 46, Nov. 21, 2001, p. 50.
Shaw, Keith, "Cool Tools: Products That Have Graced the Cool Tool's Lab . . . ," Network World, vol. 9, No. 6, Feb. 11, 2002, p. 30.
International Search Report and Written Opinion for application No. PCT/EP2014/052275 dated Jul. 9, 2014.
Akiba, Internet Site at http://akiba-pc.watch.impress.co.jp/hotline/991127/newitem.html, Nov. 27, 1999.
Firewoiks, NOMUS: All Hail The Mouse King, Internet Site at http://mattstow.com/, Jul. 1, 2008.
Second Search Report and Written Opinion by the Danish Patent and Trademark Office for application No. PA 2015 70565 dated Dec. 14, 2016.

(56) References Cited

OTHER PUBLICATIONS

PC Mag, Comfort and Support, Internet Site at http://www.pcmag.com/article2/0,2817,1190393,00.asp, Aug. 5, 2003.
Search Report and Written Opinion by the Danish Patent and Trademark Office for application No. PA 2015 70565 dated Jul. 1, 2016.
Technical Data Sheet for part #HDNS-2000, Agilent Technologies, (2000).
Technical Data Sheet for part #HDNS-2100 and HDNS-2100 #001, Agilent Technologies, (Apr. 20, 2001).
Technical Data Sheet for part #HDNS-2200 and HDNS-2200 #001, Agilent Technologies, (2000).
Search Report by the Swedish Patent Office for application No. 1551082-9 dated Aug. 2, 2017.

* cited by examiner

POINTING DEVICE

RELATED APPLICATION

This application is a U.S. National Stage Application under 35 U.S.C. § 371 of International Application No. PCT/EP2014/052275, filed Feb. 5, 2014, which claims priority to Swedish Application No. 1350139-0, filed Feb. 5, 2013, which are hereby incorporated herein by reference in the entirety.

FIELD OF THE INVENTION

The present invention generally relates to computer accessories, and more specifically to a pointing device for controlling a computer user interface.

BACKGROUND OF THE INVENTION

Personal computers are available in many different brands, sizes and types. The first generations of personal computers had limited processing power and graphic display capabilities. A keyboard was typically the only type of computer accessory used as user input device for those early personal computers. The keyboard is still a dominating user input device for personal computers because of its feasibility for massive input of text. In addition, with the advent of graphical user interfaces (GUI), pointing devices have become and remain a very common type of computer accessory. Within the context of the present patent application, a pointing device is a computer accessory adapted for allowing a computer user to control the position of a cursor in a graphical user interface of a computer, as well as to perform relation actions such as selection of an object presented in the graphical user interface. The computer mouse is probably the most known example of such a pointing device. Other known examples include a trackball, a joystick, and a touchpad.

From the many years that computer mice have been in widespread use it has become apparent that the usage is associated with various drawbacks. Several of those drawbacks relate to user ergonomics. One example of an ergonomic drawback of heavy usage of a computer mouse is neck, shoulder or elbow pain caused by asymmetric computer mouse reaching with one side of the body but not the other. The root of this problem is that the computer mouse is designed to be located and operated laterally either to the right or to the left of the keyboard.

Other frequent ergonomic problems that appear among many computer mouse users are repetitive strain injuries, such as carpal tunnel syndrome or tendonitis. These problems are believed to be caused by the gripping of the hand and flexing of the fingers upon the computer mouse.

Ergonomic pointing devices have therefore been developed as replacement of conventional computer mice. The assignee of this patent application, Contour Design, Inc., has taken the leadership in the development of ergonomic pointing devices which have been successfully sold for a number of years under the trademark RollerMouse®. PCT publication WO 02/043046 presents some earlier versions of RollerMouse® pointing devices.

The basic design of RollerMouse® pointing devices includes a housing which is designed to be placed adjacently to the lower lateral edge of the keyboard on a desktop surface or similar. (For a common QWERTY-type keyboard, the lower later edge is the edge just below the row of keys that includes the elongate space bar). An elongate cursor navigation member referred to as a rollerbar is accessible to the user at an upper part of the housing. The rollerbar is movably arranged on an elongate support member to allow rotation and translation of the rollerbar.

By rotating the rollerbar around its central axis and translation (sliding) it along the central axis, the user of a RollerMouse® pointing device may control the x and y coordinates of the cursor location in a graphical user interface of a computer to which the RollerMouse® pointing device is connected. Thus, the rollerbar acts as a cursor navigation member. To this end, the RollerMouse® pointing device has one or more built-in optical sensors capable of detecting the rotation and translation of the rollerbar, and controller means in the form of electronic circuitry capable of causing transmission of data regarding the detected rollerbar movement as cursor control signals to the computer. Furthermore, the rollerbar is designed to be depressible by the user, thereby allowing the user to perform actions corresponding to conventional mouse clicks. In addition to the rollerbar, the housing of the RollerMouse® pointing device has a set of buttons representing common mouse-related actions, such as left-click, right-click, double-click, etc.

As a result, the user may ergonomically operate the RollerMouse® pointing device to get full access to all mouse-related actions with only small hand and finger movements, using the right or left hand, or both hands, at the user's discretion. At the same time, since the RollerMouse® pointing device is located immediately below the keyboard, the user will be able to reach the keys of the keyboard with only minimum hand movements between the RollerMouse® pointing device and the keyboard. All in all, RollerMouse® pointing devices have proven effective in reducing ergonomic problems normally associated with computer cursor control.

PCT publication WO 2011/070522 presents some refined versions of RollerMouse® pointing devices. A major design leap was taken by the incorporation of the optical sensor on the inside of the rollerbar, in contrast to earlier designs in the field, where the optical sensor monitored the surface of the rollerbar from the outside.

The present inventors have realized that there is still room for certain improvements of pointing devices like, for instance, the ones referred to above. An objective of the present disclosure is therefore to provide one or more further improvements of the inner-sensor-based design concept disclosed in WO 2011/070522, the contents of which are hereby incorporated by reference in its entirety. However, it is to be noticed that the inventive improvements may at least to some extent be applied also to other pointing devices than the ones described in WO 2011/070522, including conventional, external-sensor designs.

One area for which the present inventors have identified a need for improvement is the arrangement for detecting clicks by depressing the rollerbar. Prior art pointing devices typically use a mechanical click switch beneath a part of the rollerbar or another element which moves together with the rollerbar when being depressed. When the rollerbar has been sufficiently depressed, the mechanical switch will be actuated. The rollerbar is conventionally supported by a resilient mechanism, such as one or more springs, acting as a counterforce to balance the downward pressure on the rollerbar when depressed and yielding a suitable resistance which prevents accidental depressions of the rollerbar and yet make the intended depression controllable for the user without requiring excessive click force.

A mechanical click switch and a resilient counterforce mechanism will be exposed to mechanical wear and be susceptible of dust and other disturbances. Moreover, the click sensitivity (the amount of depression required on the rollerbar so as to provoke a click operation by actuating the mechanical click switch under the counter-action from the resilient counterforce mechanism) is a complex design parameter, since the needs and preferences may vary broadly between users. One user may prefer that a substantial amount of depressive force be applied onto the rollerbar in order to provoke a click operation, whereas another user may prefer only having to use a slight touch. Therefore, prior art pointing devices have used a mechanical click force adjustment arrangement, typically accessible from the underside of the pointing device, where the user may set the threshold force needed for a click operation by turning a dial or displacing a slider handle. Moving the dial or handle affected the bias of the resilient counterforce mechanism and thus the degree to which the user's depression of the rollerbar would be counteracted. However, such a mechanical click force adjustment arrangement, too, was exposed to mechanical wear susceptible of dust and other disturbances, and also had a penalty in component and manufacturing costs.

A mechanical click switch and a resilient counterforce mechanism have other drawbacks as well, which, too, have been identified by the present inventors. For instance, the mechanical resistance needs to be of a certain amount in order to avoid accidental depressions when translating and scrolling the rollerbar. A considerable force is therefore needed to command a click. This may be difficult to perform in a situation where high precision rollerbar movements are frequent, such as for instance in CAD, image processing or designer programs. Also, the actuation of the mechanical switch causes an audible click, which at the same time serves as a click feedback to the user. This audible click is however not customizable. Moreover, the return motion of the resilient counterforce mechanism when the rollerbar depression is released may cause a noticeable effect to the user and disturb the forthcoming rollerbar operation.

SUMMARY

It is accordingly an object of the invention to eliminate or alleviate at least some of the problems referred to above.

A first aspect of the present invention therefore is a pointing device for controlling a computer user interface. The pointing device comprises:

a housing, the housing having a base part;

an elongate support member;

an elongate cursor navigation member, the cursor navigation member being movably arranged for rotation about the support member and translation along the support member, the cursor navigation member further being depressible with respect to the base part;

a plurality of sensors for detecting rotation, translation and depression of the cursor navigation member;

computer interface circuitry for connection to a computer; and a controller connected to the plurality of sensors, the controller being configured to cause transmission of data regarding rotation, translation and depression of the cursor navigation member to the computer through the computer interface circuitry.

The plurality of sensors include contactless click sensors for detecting deflection of the support member caused when a user depresses the cursor navigation member, the controller being configured to monitor the outputs from the contactless click sensors to detect that the detected deflection exceeds a click operation threshold value, and in response determine that a mouse click operation is intended by the user's depression and cause transmission of data representing the mouse click operation to the computer through the computer interface circuitry.

Furthermore, the controller has a click sensitivity adjustment mode for allowing the user to configure the click operation threshold value.

Thanks to this first aspect of the invention, a pointing device is provided which addresses at least some of the problems associated with a mechanical click switch, a resilient counterforce mechanism and a mechanical click force adjustment arrangement in the prior art. It is beneficial in terms of operational reliability and also operational accuracy. It furthermore offers a reduction in component costs thanks to the avoidance of expensive mechanical components.

The second aspect of the present invention is a pointing device for controlling a computer user interface. The pointing device comprises:

a housing, the housing having a base part;

an elongate support member;

an elongate cursor navigation member, the cursor navigation member being movably arranged for rotation about the support member and translation along the support member, the cursor navigation member further being depressible with respect to the base part;

a plurality of sensors for detecting rotation, translation and depression of the cursor navigation member;

computer interface circuitry for connection to a computer;

a controller connected to the plurality of sensors, the controller being configured to cause transmission of data regarding rotation, translation and depression of the cursor navigation member to the computer through the computer interface circuitry; and a vibration generating unit connected to the controller.

The plurality of sensors include contactless click sensors for detecting deflection of the support member caused when a user depresses the cursor navigation member, the controller being configured to monitor the outputs from the contactless click sensors to detect that the detected deflection exceeds a click operation threshold value, and in response determine that a mouse click operation is intended by the user's depression and cause transmission of data representing the mouse click operation to the computer through the computer interface circuitry.

The controller is configured, in response to having determined that a mouse click operation is intended by the user's depression, to send a control or drive signal to the vibration generating unit to cause generation of a vibration and a sound as a feedback to the user of the mouse click operation committed by the depression of the support member.

Thanks to this second aspect of the invention, a pointing device is provided which addresses at least some of problems associated with a mechanical click switch in the prior art. It allows for an efficient and controllable click feedback to the user without being dependent on a mechanical click switch to generate the feedback.

The first and second aspects of the invention can be combined into one common aspect in some embodiments to yield a pointing device having all the features of the first aspect as well as all the features of the second aspect.

For either or both of the first and second aspects of the invention, the support member may be a hollow rod being suspended at its ends to allow certain depression, wherein the elongate cursor navigation member may be is a hollow sleeve or cylinder disposed on the hollow rod. The contactless click sensors may be magnetic sensors which are provided inside the hollow rod at positions near or at the ends of the hollow rod. A printed circuit board may be provided inside the hollow rod, wherein the contactless click sensors may be mounted to the printed circuit board, wherein the plurality of sensors further may include a laser sensor for detecting rotation and translation of the hollow sleeve or cylinder, and wherein the laser sensor may also be mounted to the printed circuit board.

Forming the support member as a hollow rod in this manner gives a certain springiness which counteracts the user's depression and therefore eliminates the need for a resilient counterforce mechanism like in the prior art.

This represents a space-efficient as well as operationally reliable arrangement, where the sensors for detecting all relevant cursor navigation member movements (rotation, translation as well as depression) are contained inside and protected by the support member in the form of the hollow rod.

In one or more embodiments, the pointing device comprises a button set in or at an upper part of the housing, individual buttons of the button set representing respective mouse-related or other user interface related actions. The controller is configured to monitor the button set to detect a certain first type of user actuation of one or more individual buttons, and in response enter the click sensitivity adjustment mode.

The certain first type of actuation may for instance be a long-press on one specific individual button. Alternatively, the certain first type of actuation may be a simultaneous press on two specific individual buttons.

Furthermore, in such one or more embodiments, the controller may be configured, in the click sensitivity adjustment mode, to monitor the button set to detect a certain second type of user actuation of one or more individual buttons, and in response determine a selected setting among a plurality of available click sensitivity settings which represent different available values of the click operation threshold value.

The certain second type of actuation may for instance be in the form of repeated short-presses on one specific individual button, or a scrolling of a scroll wheel included in the button set.

The controller may further be configured to store the selected setting in a memory.

These one or more embodiments are particularly advantageous in that they offer a highly convenient manner for the user to configure the click sensitivity by using buttons available at an upper part of the pointing device, in contrast to a bottom side of it like in the prior art. Also, separate mechanical components for adjusting the click sensitivity are avoided, therefore saving space, weight as well as cost.

In one or more embodiments, the vibration generating unit is positioned laterally with respect to a center of the support member. For embodiments where the support member is a hollow rod, the vibration generating unit may be mounted to the printed circuit board inside the hollow rod at a lateral position with respect to a center section of the hollow rod. This means that the vibration which causes the click feedback sound is not generated where the user typically has his fingers on the rollerbar, hence reducing the risk of interfering with the user's rotation or translation of the cursor navigation member and improving the cursor navigation accuracy.

The vibration generating unit may have a movable member which causes the vibration and sound by a reciprocating motion in a direction transversal to the direction in which the cursor navigation member is depressible with respect to the base part.

To this end, the vibration generating unit may be an electric solenoid, and the movable member may be a plunger of the solenoid. The plunger of the solenoid may generate the vibration and sound by interacting with a housing of the solenoid. Alternatively, the plunger of the solenoid may generate the vibration and sound by interacting with an element being external to the housing of the solenoid, the element being one of an element mounted to the printed circuit board, and the hollow rod.

These features will further reduce the possible interference with the user's rotation or translation of the cursor navigation member, and hence improve the cursor navigation accuracy.

In one or more alternative embodiments, the vibration generating unit has a movable member which causes the vibration and sound by a rotational motion which strikes an element being external to the vibration generating unit. This element may for instance be an element mounted to the printed circuit board, or the hollow rod. In this or these alternative embodiments, the vibration generating unit may be an electric motor, wherein the movable member is an asymmetrical member mounted to a shaft of the electric motor.

In one or more refined embodiments, the amount of vibration and sound generated by the vibration generating unit is configurable by the user. For instance, a magnitude of the control or drive signal to the vibration generating unit may be configurable by the user using the aforementioned button set in any of the ways referred to above for setting the click sensitivity according to the first aspect of the invention.

This allows the user to configure the click feedback in a way which was not possible with a mechanical click switch in the prior art.

Furthermore, in one or more embodiments, advantageous additional use of the vibration generating unit is made for causing user feedback from actuation of the scroll wheel in the button set referred to above for the first aspect of the invention. To this end, in response to detecting actuation of the scroll wheel, the controller may be configured to send a burst of control or drive signals to the vibration generating unit so as to cause generation of intermittent vibrations and a ticking sound as a feedback to the user of a scroll operation committed by the actuation of the scroll wheel.

In one or more refined embodiments, the notion of silent clicks is introduced. The controller is configured, in response to having determined that a mouse click operation is intended by the user's depression of the cursor navigation member, to:

check a memory setting to determine whether user feedback of mouse click operations is disabled;

if so, cause transmission of the data representing the mouse click operation to the computer through the computer interface circuitry but refrain from sending a control or drive signal to the vibration generating unit to avoid causing generation of a vibration and a sound; and otherwise, cause transmission of the data representing the mouse click operation to the computer through the computer interface circuitry and send the control or drive signal to the vibration generating unit to cause generation of the vibration and sound.

In this way, whether or not an audible click feedback is to be caused will be user configurable in a way which was not possible with a mechanical click switch in the prior art.

BRIEF DESCRIPTION OF DRAWINGS

Objects, features and advantages of embodiments of the invention will appear from the following description, reference being made to the accompanying drawings.

DETAILED DESCRIPTION

Figure 1:
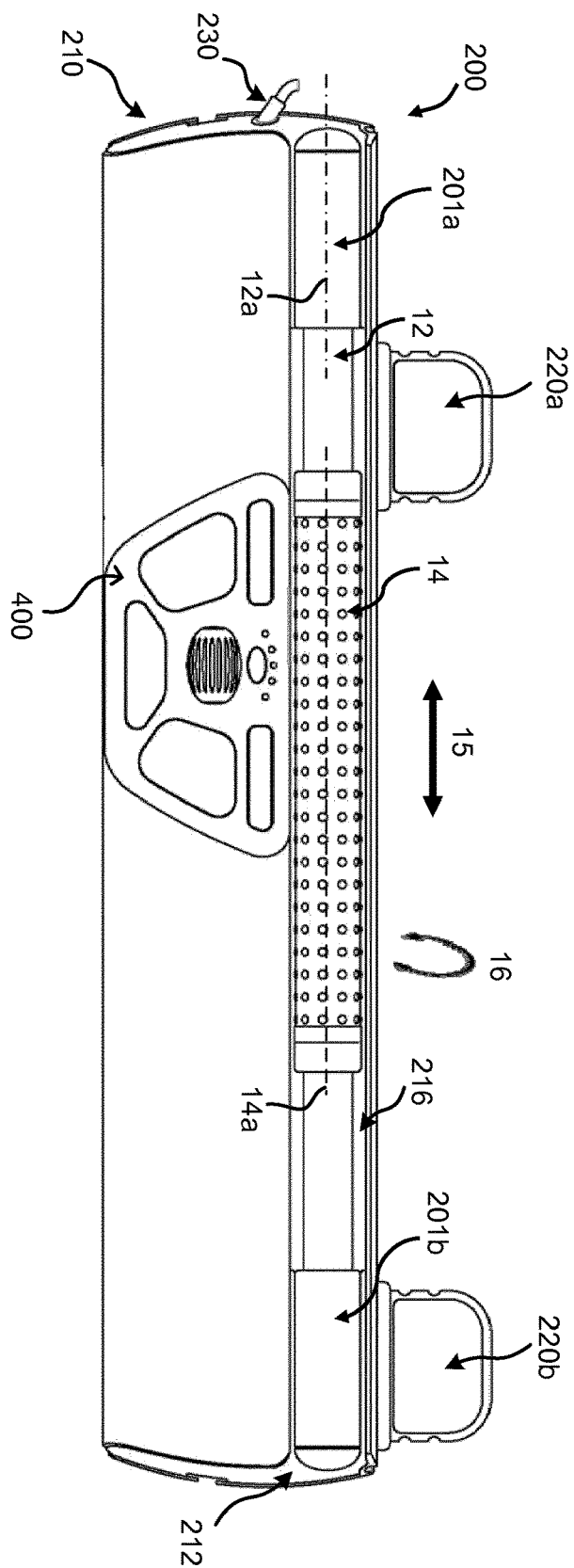
FIG. 1 is a schematic top view of a pointing device according to one embodiment.

Embodiments of the invention will now be described with reference to the accompanying drawings. The invention may, however, be embodied in many different forms and should not be construed as limited to the embodiments set forth herein; rather, the embodiments are provided in order for this disclosure to be thorough and complete, and to convey the scope of the invention to those skilled in the art. The terminology used in the detailed description of the particular embodiments illustrated in the accompanying drawings is not intended to be limiting of the invention. In the drawings, like numbers refer to like elements.

Figure 2:
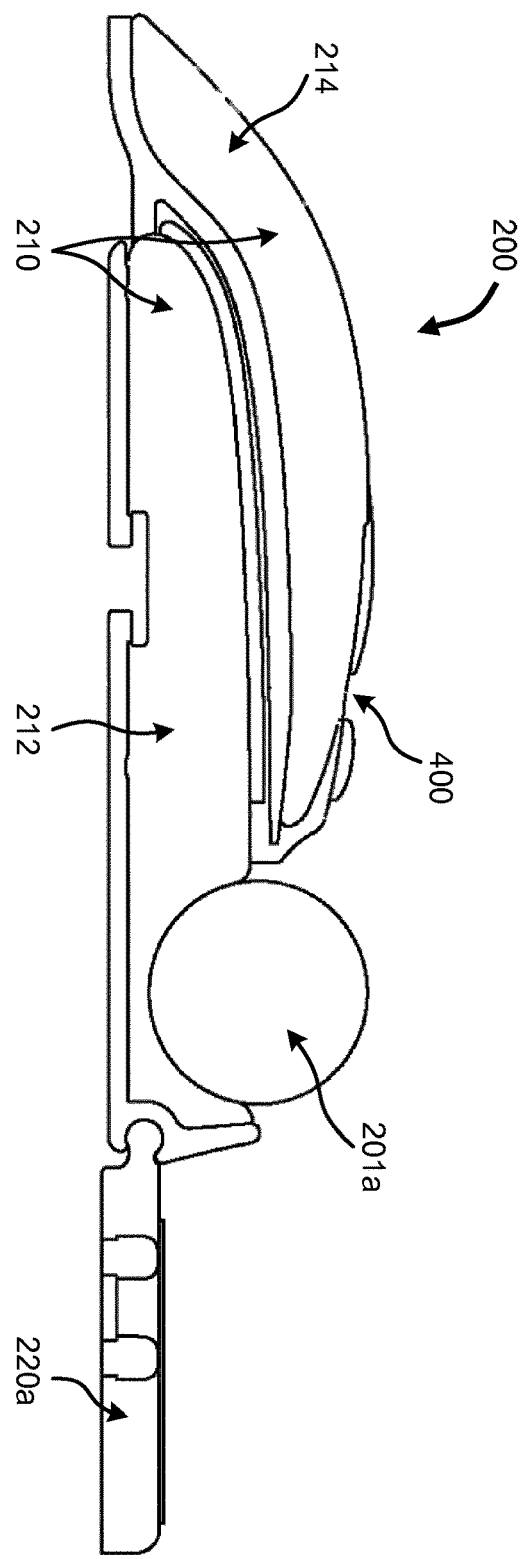
FIG. 2 is a schematic side view of the pointing device shown in FIG. 1.

FIGS. 1 and 2 disclose a pointing device 200 according to an embodiment of the present invention. The pointing device 200 according to this embodiment enjoys the trademark RollerMouse Re:d. The pointing device 200 is designed to act as an ergonomic substitute for a conventional computer mouse and thus has an interface, such as a serial USB interface, for connection to a computer. A serial cable connection 230 is seen in FIG. 1; in other embodiments, the pointing device may communicate wirelessly with the computer via, for instance, Bluetooth, NFC or WLAN (IEEE 802.11) communication.

The pointing device 200 is compatible with various computer operating systems, including Apple® OS X, Apple Max OS 8.1 or newer, Microsoft® Windows XP, Microsoft® Windows 7, Microsoft® Windows 8, and Microsoft® Windows Server. A computer is not shown in FIGS. 1 and 2, but the pointing device 200 is nevertheless designed to be placed with one edge or lateral side (the uppermost edge in FIG. 1 and the rightmost edge in FIG. 2) being located immediately adjacent to the lower lateral edge of a keyboard of such a computer. When the keyboard is a QWERTY-type keyboard, its lower later edge is the edge which is just below a first row of keyboard keys which include an elongate space bar. Keyboard risers 220a, 220b assist in safely receiving the lower lateral edge of the keyboard at a suitable height.

The pointing device 200 has a housing 210 with a base part 212, the bottom side of which is adapted to be placed onto a suitable workspace surface, such as a desktop surface. The base part 212 may be made of a durable material, such as aluminium. Wrist-rest cushions or pads 214 are provided at the upper side of the housing 210. In a recess 216 in the housing 210, an elongate cursor navigation member 14 is provided which is movably arranged for rotation about an elongate support member 12 and translation along the support member.

In the disclosed embodiment, the elongate support member 12 is a hollow rod 12 having a central axis seen at 12a in FIG. 1. In the disclosed embodiment, the cursor navigation member 14 is a hollow sleeve or cylinder 14 having a central axis seen at 14a in FIG. 1. The hollow sleeve or cylinder 14, which will be referred to as "the rollerbar 14" in the remainder of this detailed description, is movably threaded or otherwise disposed onto the elongate support member 12, i.e. the hollow rod 12. The central axes 12a and 14a coincide; the rollerbar 14 and the hollow rod 12 are thus coaxially arranged with respect to each other. Moreover, the central axes 12a and 14a are essentially level with the bottom side of the base part 212. Hence, when the pointing device 200 is placed on a desktop surface (etc), the central axes 12a and 14a will be essentially horizontal.

By rotating the rollerbar 14 around the central axes 12a, 14a, see rotational double-ended arrow 16 in FIG. 1, and translation (sliding) it along the central axes 12a, 14a (see linear double-ended arrow 15 in FIG. 1), the user of the pointing device 200 may control the x and y coordinates of the cursor location in a graphical user interface of the computer to which the pointing device 200 is connected. The directions of translation 15 of the rollerbar 14 will be along the central axes 12a and 14a, i.e. essentially horizontal.

Moreover, the rollerbar 14 is movable, together with the hollow rod 12, to a certain extent also in a normal direction with respect to the central axes 12a and 14a (and the bottom side of the base part 212). This allows the user to perform mouse click operations (typically single-clicks, also referred to as left clicks or mouse down/mouse up events).

To this end, as seen in FIG. 1, the hollow rod 12 is suspended at its ends 201a and 201b in a manner such that it allows certain depression thereof. The hollow rod 12 may advantageously be made of a suitable metal material and have dimensions (length vs thickness) which gives it a desired trade-off between durability and yet a certain springiness. This eliminates the need for a separate resilient counterforce mechanism like in the prior art. The rollerbar 14 may have a rubber or similar coating which provides certain friction to avoid a slip of the user's fingers. A textured surface pattern on the rollerbar 14 may optimize the engagement with the user's fingers and enhance the "feel" to the user.

Figure 5:
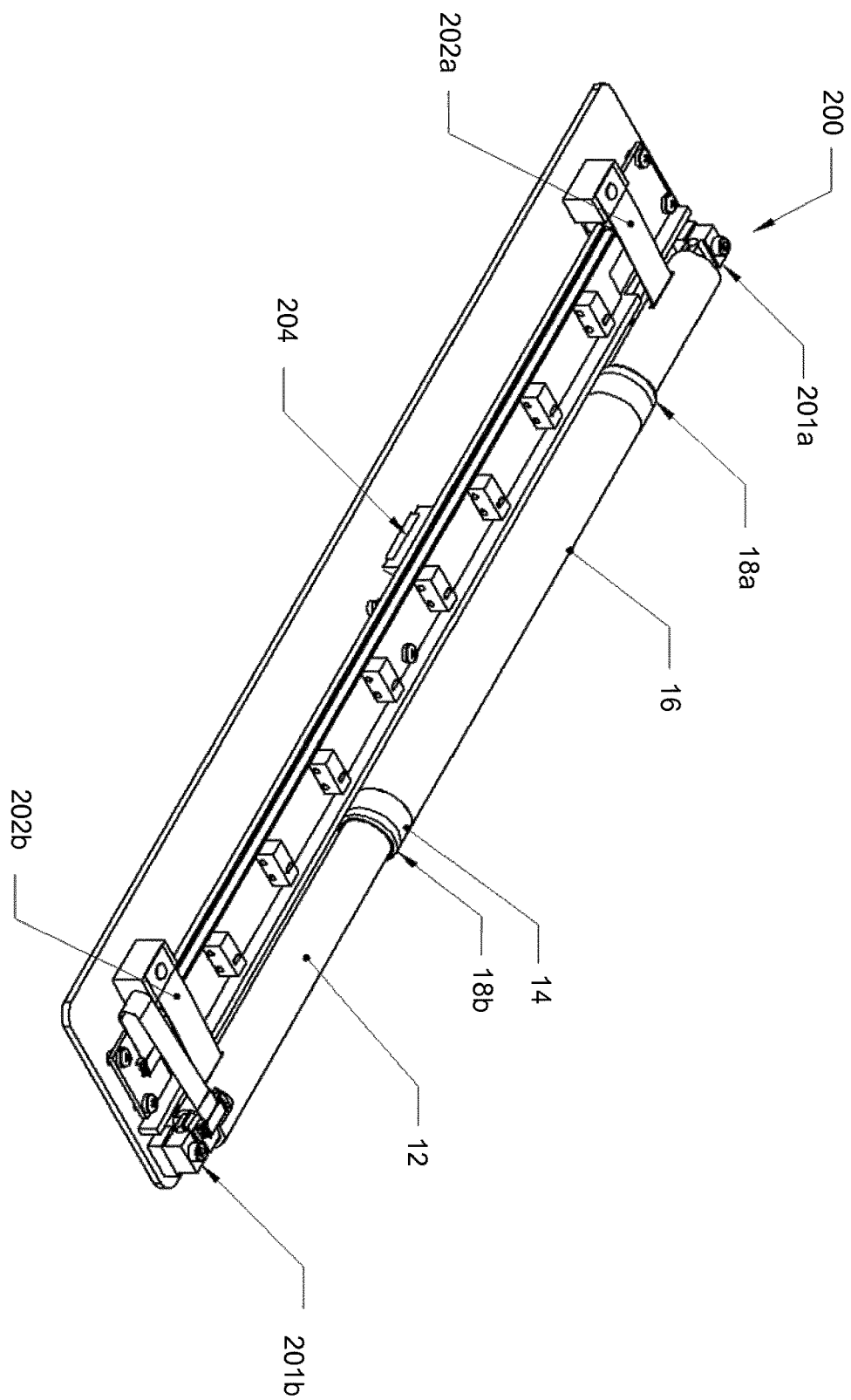
FIG. 5 is a schematic perspective view of a pointing device according to one embodiment.
Figure 6:
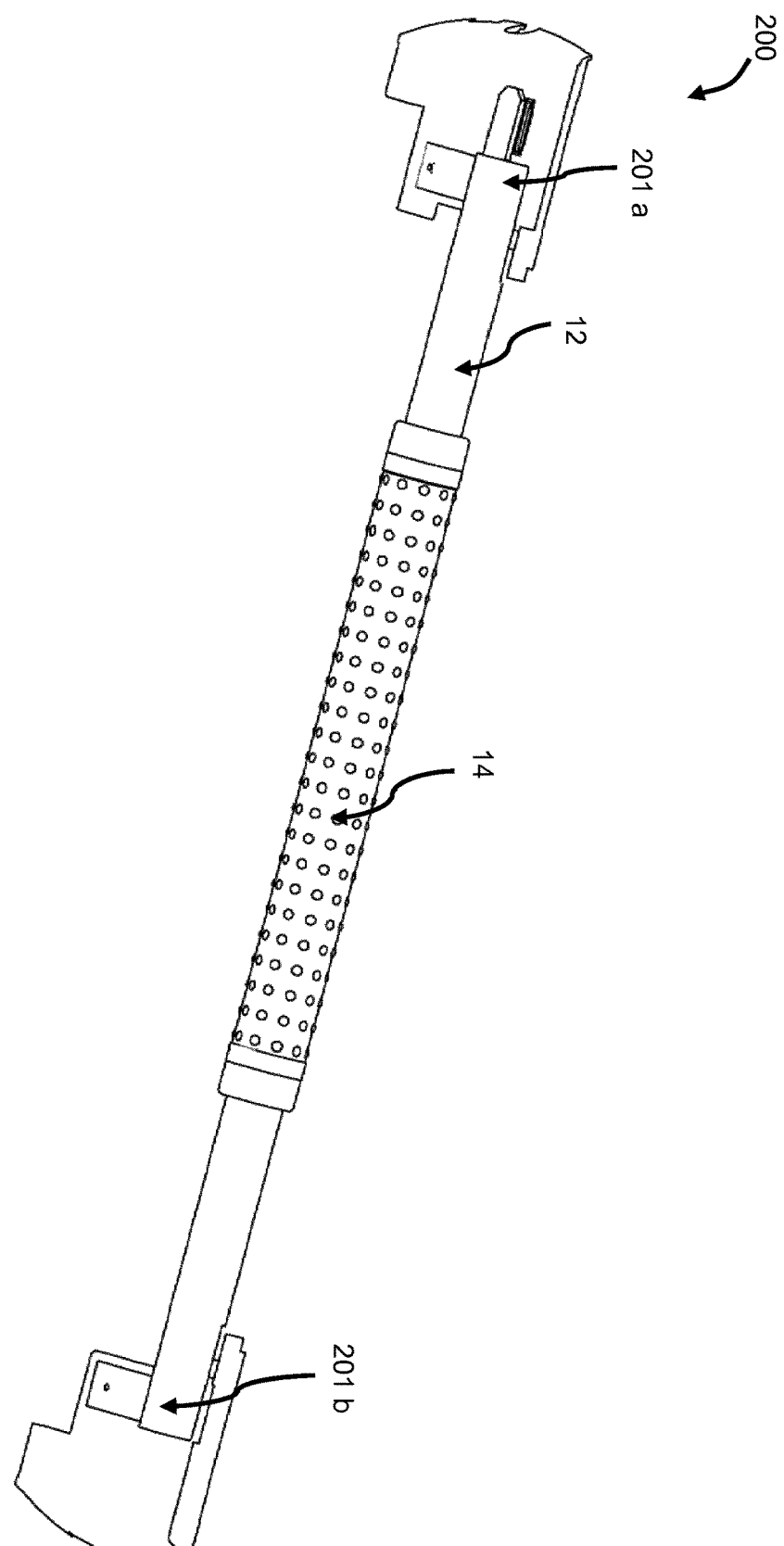
FIG. 6 is a detailed view of an elongate cursor navigation member movably arranged on an elongate support member in the pointing device shown in FIGS. 1 to 4.

The exact mechanical design of the hollow rod 12 and the rollerbar 14 can vary. One possible design of the hollow rod 12 and the rollerbar 14 is shown in FIG. 6. Other possible designs are found the aforementioned WO 2011/070522. One of these possible designs, illustrated in WO 2011/070522 as FIG. 15a, is reproduced among the drawings of the present application as FIG. 5.

Inside the housing 210, the pointing device 200 has a plurality of sensors for detecting rotation, translation and depression of the rollerbar 14. Among these, a laser sensor (optical sensor; seen at 602 in other drawings) detects the rotation and translation of the rollerbar 14.

Figure 7:
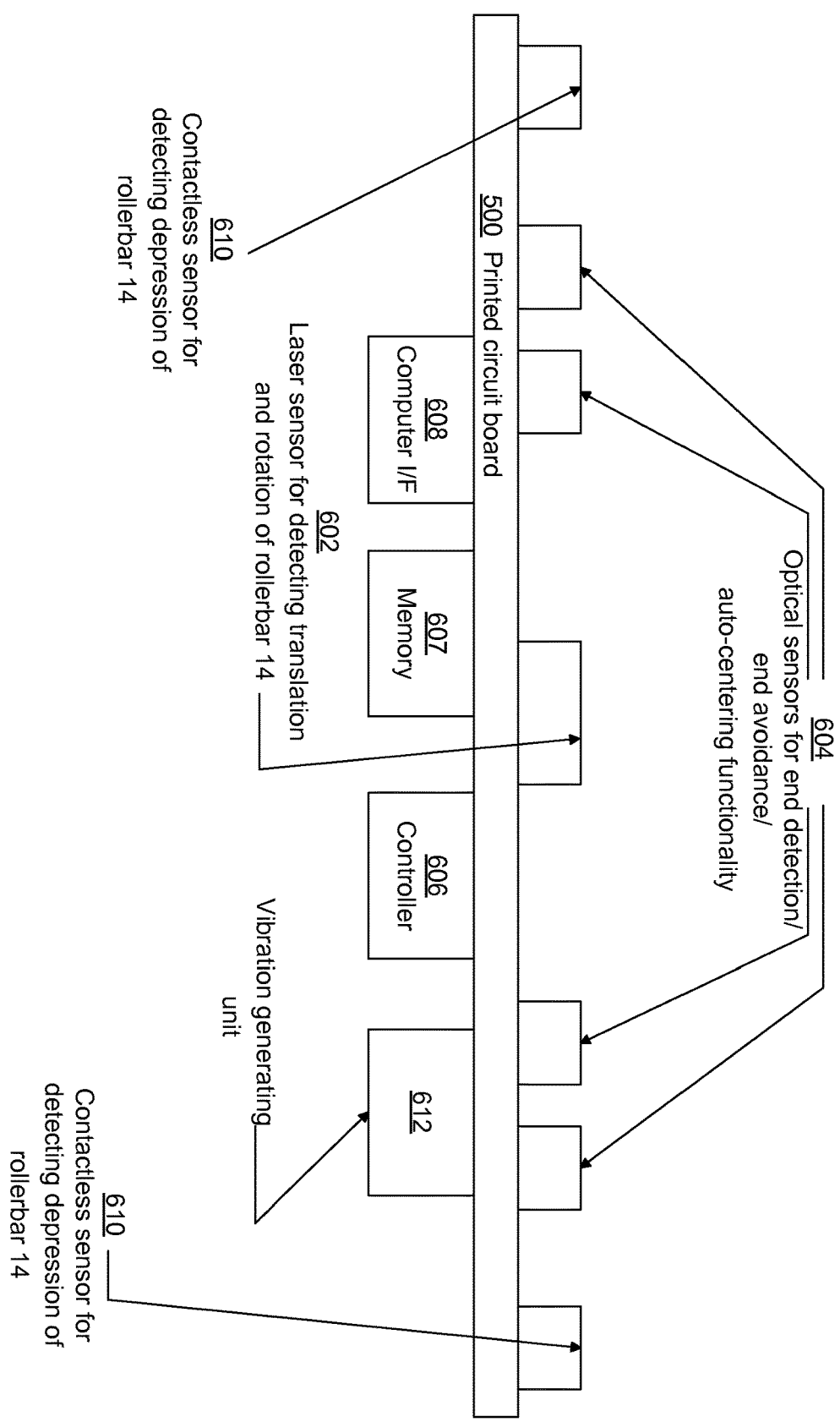
FIG. 7 is a schematic block diagram of different internal components of the pointing device according to one embodiment, showing the components mounted to a printed circuit board.

A controller (seen schematically at 606 in FIG. 7 and other drawings) in the form of electronic circuitry is connected to or otherwise associated with the laser sensor 602, and causes transmission of data regarding the detected rotations and translations of the rollerbar 14 as cursor control signals to the computer by means of computer interface circuitry (seen schematically at 608 in FIG. 7 and other drawings).

Moreover, the plurality of sensors includes contactless click sensors (seen schematically at 610 in FIG. 7 and other drawings) for detecting depressions of the rollerbar 14. The controller 606 causes transmission of data regarding the detected rollerbar depressions as click mouse operation, or mouse event, control signals to the computer by means of the computer interface circuitry 608.

Figure 3:
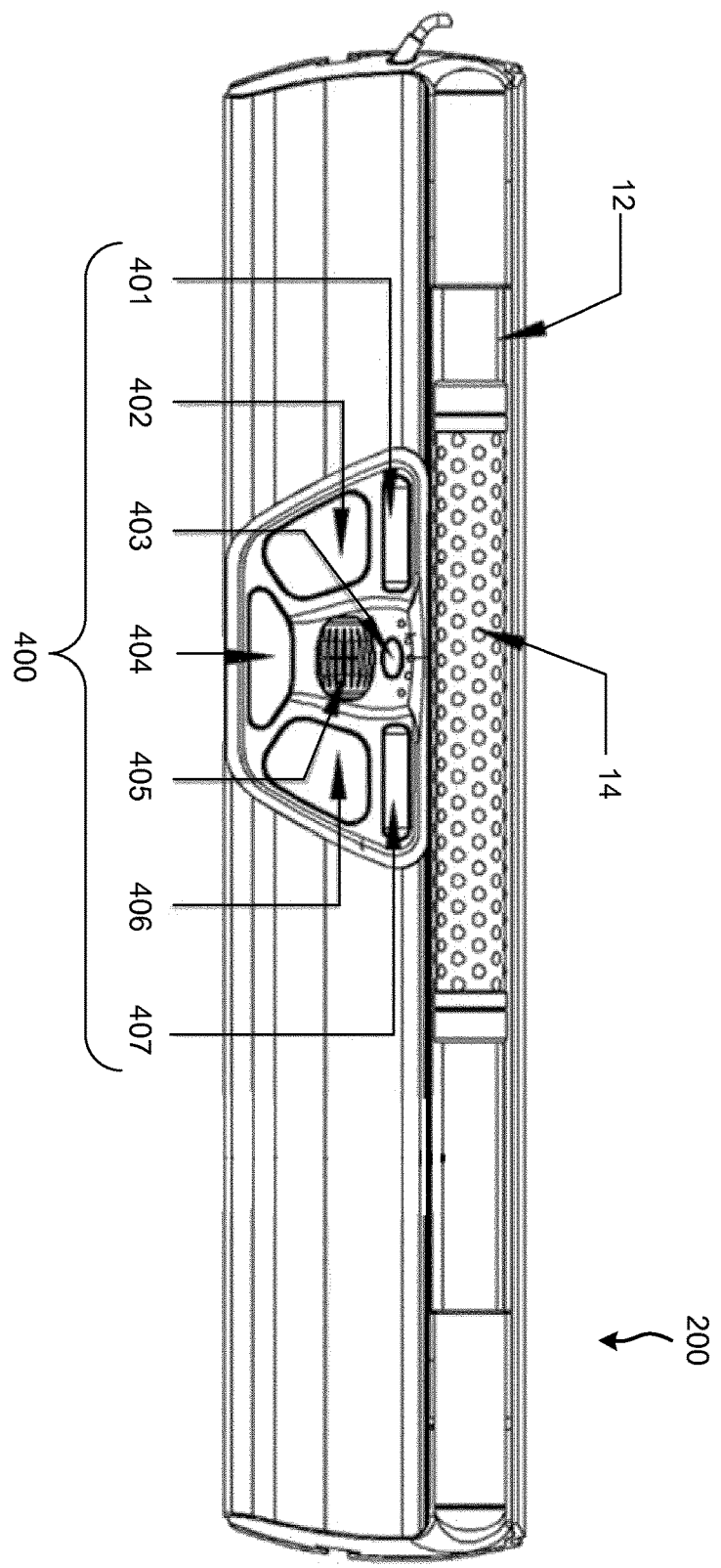
FIG. 3 illustrates a button set on the pointing devices shown in FIGS. 1 and 2 in more detail.

In addition to the depressible rollerbar 14, the user has access to a button set 400 provided beneath the rollerbar 14 in or at the housing 210. Individual buttons in the button set 400 represent common mouse-related and other user interface-related actions, as will now be described with reference to FIG. 3.

A first button 401 represents Copy. With this button, the user may command a copy operation (like for instance "Ctrl-C") upon a marked object in the computer user interface by a single tap on the button 401.

A second button 402 represents Left click. With this button, the user may command a left-click (or single-click) mouse operation upon an object in the computer user interface.

Figure 4:
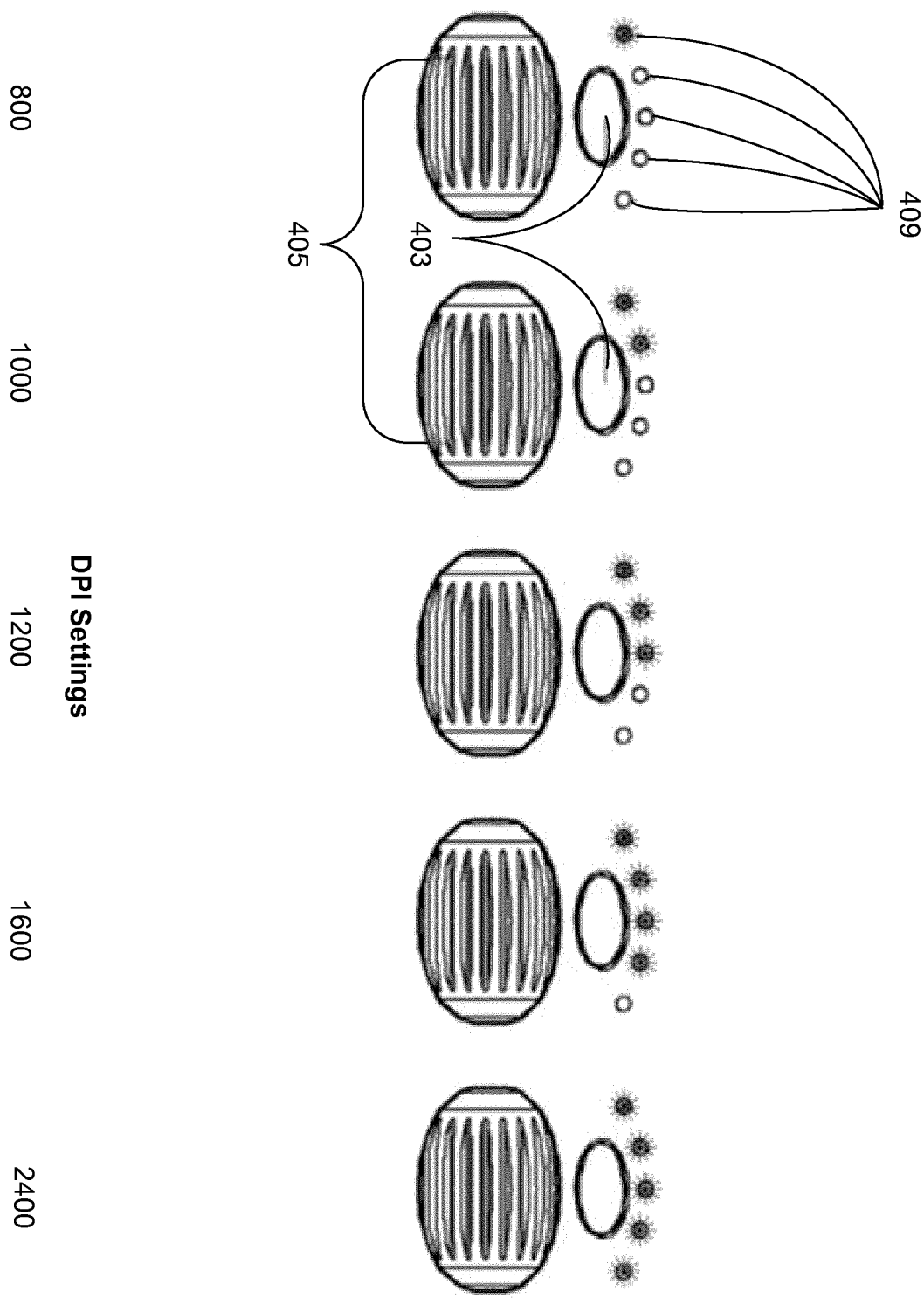
FIG. 4 is a detailed view of a scroll wheel included in the button set shown in FIG. 3, together with an associated set of LED indicators.

A third button 403 allows user-configurable setting of the cursor speed. This is illustrated in FIG. 4. The button 403 can be used to choose between, for instance, five different cursor speeds. The cursor speed is a function of the resolution of the laser sensor 602. The selected cursor speed is indicated by a corresponding number of LED indicators 409 being lit or turned off, as the user repeatedly presses the button 403. The numerical value of each cursor speed setting, expressed in Dots Per Inch (DPI), is seen at the bottom of FIG. 4. As will the described in more detail later, in one embodiment, the button 403 (and the LED indicators 409) may additionally or alternatively be used for providing user-configurable setting of the click sensitivity, i.e. the amount of depression of the rollerbar 14 required to trigger a mouse click operation. Further possible additional or alternative uses will also be described in some detail later.

A fourth button 404 represents Double click. With this button, the user may command a double-click mouse operation upon an object in the computer user interface—i.e. generate two single-clicks shortly after one another.

A fifth button 405 is a Scroll wheel. With this button, the user may perform scrolling actions on information presented in the computer user interface by rotating the scroll wheel up or down, as well as selecting in the presented information by depressing the scroll wheel. As will the described in more detail later, in one embodiment, the scroll wheel 405 may additionally or alternatively be used for providing user-configurable setting of the amount of acoustic click feedback to be caused by a vibration generating unit upon when the user performs a mouse click operation by depressing the rollerbar 14. Further possible additional or alternative uses will also be described in some detail later.

A sixth button 406 represents Right click. With this button, the user may command a right-click mouse operation upon an object in the computer user interface.

A seventh button 407 represents Paste. With this button, the user may command a paste operation (like for instance "Ctrl-V") for an object in the computer user interface by a single tap on the button 407.

An explained in the Background section, click sensitivity is a design parameter which poses considerable complexity, since the needs and preferences may vary broadly between users. One user may prefer that a substantial amount of depressive force or distance be applied onto the rollerbar 14 in order to provoke a click operation, whereas another user may prefer only having to use a slight touch.

One aspect of the present invention provides an improved manner of obtaining user-configurable and accurate click sensitivity. This will now be explained in more detail with reference to the remaining drawings.

Figure 8:
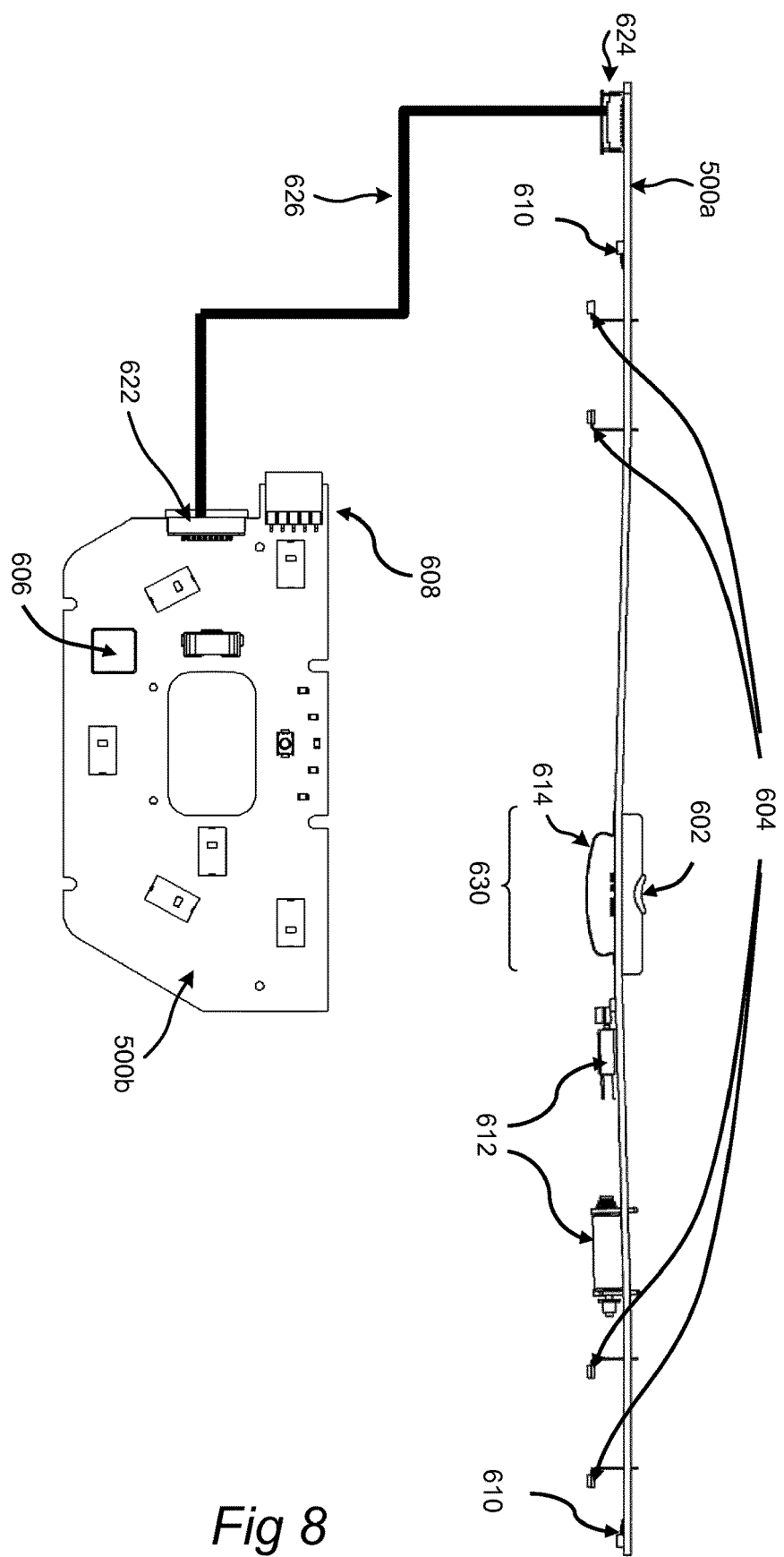
FIG. 8 is a schematic top and side view of the internal components of the pointing device according to one embodiment, showing the components distributed among first and second printed circuit boards.

FIG. 7 discloses some internal components of the pointing device 200 on a schematic level. The components 602 to 612 are mounted either to a single common printed circuit board 500 (as shown in FIG. 7), or distributed among more than one printed circuit board 500a, 500b (as shown in FIG. 8). In the alternative shown in FIG. 8, components 606 and 608 are mounted to a secondary printed circuit board 500b, whereas the other components 602, 604, 610, 612 are mounted to a main printed circuit board 500a. The main printed circuit board 500a and the secondary printed circuit board 500b are connected by wiring 626 via connectors 622 and 624.

Figure 9:
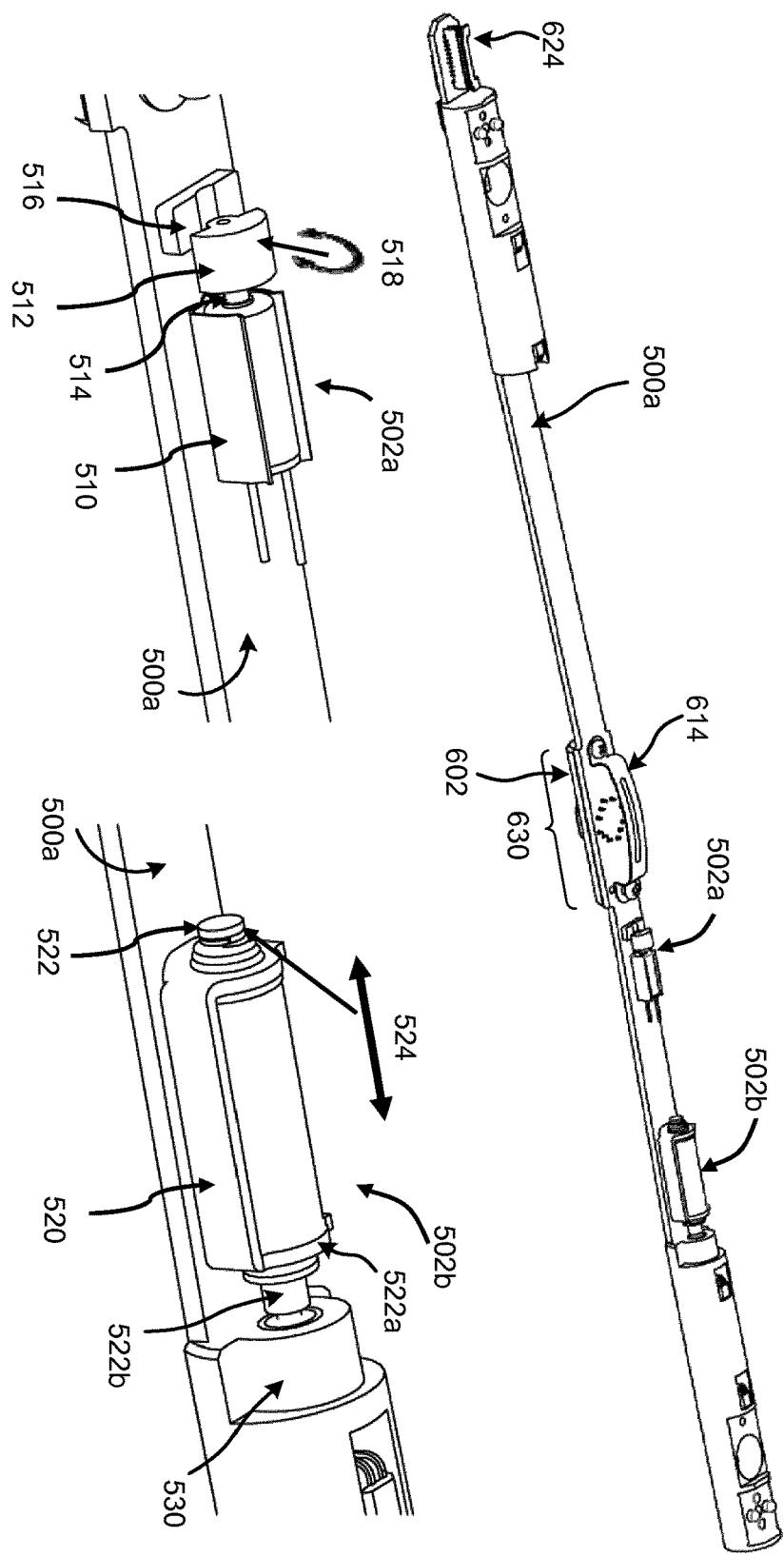
FIG. 9 is a schematic perspective view of the first printed circuit board shown in FIG. 8 and the components mounted thereon, including a vibration generating unit, wherein FIG. 9 also illustrates enlarged detailed views of two possible implementations of the vibration generating unit.
Figure 10:
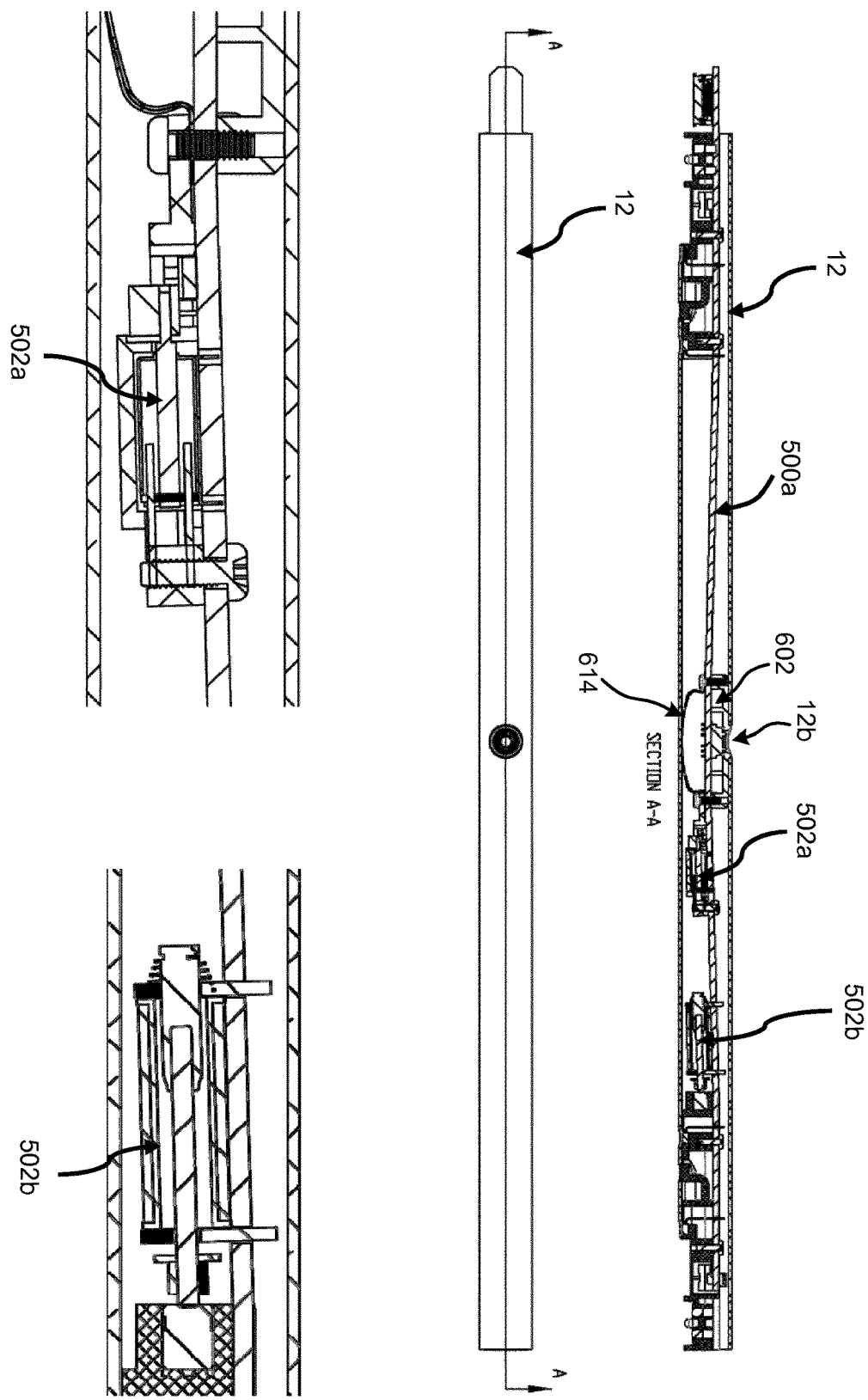
FIG. 10 contains sectional views corresponding to the perspective views shown in FIG. 9.
Figure 11:
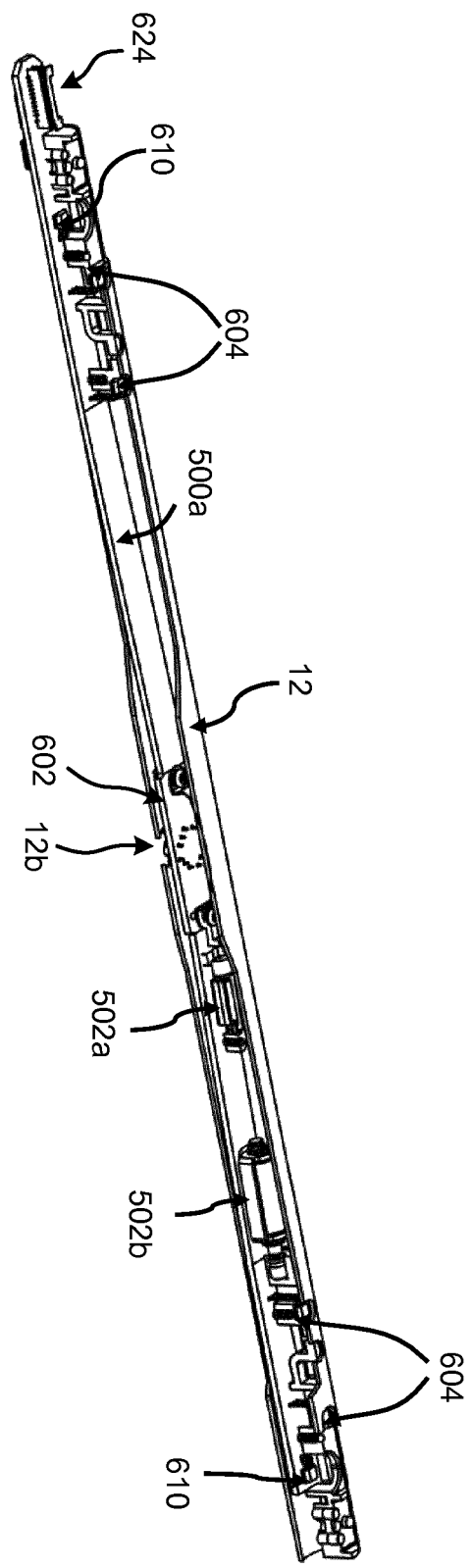
FIG. 11 is a schematic perspective view of the first printed circuit board shown in FIG. 8, corresponding to the view in FIG. 9 but also showing a fraction of the elongate support member.

The single common printed circuit board 500 or the main printed circuit board 500a is provided inside the hollow rod 12, as is seen more clearly in FIGS. 9 to 11.

The laser sensor 602, controller 606 and computer interface circuitry 608 have already been described above. The controller 606 has a memory 607, which may be internal in or external to the controller 606, or a combination of both.

A ground spring 614 is mounted on the underside of the printed circuit board 500a at a center section 630 of the hollow rod 12. The laser sensor 602 is mounted on the opposite side of the printed circuit board 500a in the center section 630 of the hollow rod 12. As is best seen in FIGS. 10 and 11, the laser sensor 602 is aligned with an opening 12b in the hollow rod 12. This allows the laser sensor 602 to monitor rotation and translation of the surrounding rollerbar 14.

The ground spring 614 may have one or both of these purposes:

1) To support the center section of the main printed circuit board 500a against the inside of the hollow rod 12, thereby providing a stable position for the high-precision laser sensor 602 correctly aligned with the opening 12b in the hollow rod 12.

2) To short any static electricity occurring inside the metallic hollow rod 12, thereby protecting the components on the main printed circuit board 500a against electric shock.

Four optical sensors 604 allow the controller 606 to monitor the momentary position of the rollerbar 14 relative to the end positions thereof along the central axis 12a of the hollow bar 12, so as to provide functionality for one or more of the following functions: cursor end detection, cursor end avoidance, and cursor auto centering. The sensors 604 are not vital to the inventive aspects currently claimed in the present application as filed.

The contactless click sensors 610 comprises two Hall effect sensors (or Hall elements or Halifax sensors) 610 positioned distally near or at the ends 201*a* and 201*b* of the hollow rod 12. The Hall effect sensors interact with magnets or other sources of magnetic fields provided distally near or at the ends 201*a* and 201*b* of the hollow rod 12 and are therefore capable of detecting vertical deflection of the hollow rod 12 caused when the user depresses the rollerbar 14. The magnets or other sources of magnetic fields may for instance be mounted within roller bar end capsules at the ends 201*a* and 201*b*, or in the recess 216 near the ends 201*a* and 201*b*. It is to be noticed that other kinds of sensor technologies than magnetic sensors, including but not limited to optical or capacitive technologies, may be used in other embodiments for detecting the vertical deflection of the hollow rod 12.

The controller 606 is connected to the Hall effect sensors 610 and is configured to monitor when the outputs of the Hall effect sensors 610 indicate that the momentary vertical deflection of the hollow rod 12 exceeds a click operation threshold value. When the click operation threshold value is exceeded, a click operation is determined to have occurred—i.e., the user's depression is assumed to be intended as a click operation rather than an accidental depression caused when rotating or translating the rollerbar 14 for cursor navigation.

The controller 606 may be configured to determine that the click operation threshold value has been exceeded if the output from one of the Hall effect sensors 610 exceeds a certain value whereas the other does not (which may occur if the user depresses the rollerbar 14 at a non-central position along the central axis 12*a* of the hollow rod 12), or alternatively if the outputs of both Hall effect sensors 610 exceed a certain value, or alternatively if the mean value of the outputs of the Hall effect sensors 610 exceed a certain value.

When the controller 606 has determined that the click operation threshold value has been exceeded, and hence that that a mouse click operation is intended by the user's depression, it will cause transmission of data representing the mouse click operation to the computer through the computer interface circuitry 608. The data will be sent as a control signal to the computer, thereby indicating to the computer that a mouse click operation has occurred (more specifically, the leading part of the click operation in the form of a mouse-down event).

In addition, in some embodiments, the controller 606 will send a control or drive signal to a vibration generating unit 612 to cause generation of a vibration and a sound as a feedback to the user of the mouse click operation committed by the depression of the rollerbar 14. Some preferred implementations of the vibration generating unit 612 will be described later in this section.

When the user releases the depression of the rollerbar 14, the controller means 606 will conversely determine that the vertical deflection of the hollow rod 12 is now less than the click operation threshold value, and in response signal to the computer via the interface 608 that a mouse-up event (i.e. the trailing part of the mouse click operation) has occurred. In addition, in some embodiments, the controller 606 will send a second control or drive signal to the vibration generating unit 612 to cause generation of a second vibration and sound as a feedback to the user of the (trailing part of) the mouse click operation committed by releasing the depression of the rollerbar 14.

The pointing device 200 has user configurable click sensitivity, as will now be described. To this end, the controller 606 has a click sensitivity adjustment mode for allowing the user to configure the click operation threshold value. In one embodiment, the controller 606 is configured to monitor the button set 400 to detect a certain first type of user actuation of one or more of the individual buttons, and in response enter the click sensitivity adjustment mode.

The certain first type of actuation may for instance be a long-press on one specific individual button, such as the Left click button 402, or a simultaneous press on two specific individual buttons, such as the Left click button 402 together with the Right click button 406.

In the click sensitivity adjustment mode, the controller 606 is configured to monitor the button set 400 to detect a certain second type of user actuation of one or more of its individual buttons, and in response determine a selected setting among a plurality of available click sensitivity settings which represent different available values of the click operation threshold value associated with the Hall effect sensors 610. The different available values may be stored in memory 607 which is accessible to the controller 606.

The certain second type of actuation may for instance be repeated short-presses on one specific individual button, such as the button 403. Hence, in such an embodiment, the button 403 may be used not only for setting the cursor speed as referred to above, but also for setting the click sensitivity by toggling between a plurality of different available click sensitivity settings. The LED indicators 409 may be used to guide the user in this process.

Alternatively, the certain second type of actuation may be a scrolling of the scroll wheel 405 included in the button set 400.

As the setting has been selected, the controller 606 may store the configured click sensitivity in the memory 607. This will allow the controller 606 to read and apply a current setting from memory 607 when the pointing device is powered up from the computer through the computer interface circuitry 608.

In alternative embodiments, the click sensitivity adjustment mode may be entered directly upon actuation of the button which also selects the setting. This may for instance be so if a dedicated click sensitivity button is provided (which may be the button 403, if cursor speed setting is not provided or dedicated to this button).

The arrangement described above, with the contactless click sensors and the click sensitivity adjustment mode, has several advantages over the prior art, as has already been explained in the Summary section. For instance, since mechanical components are susceptible of malfunction due to wear and tear and in addition also are expensive, an improved long-term operational reliability may be obtained together with a cost saving. Also, the user's ability to control the rollerbar at high precision is improved.

Some different possible (but non-limiting) implementations of the vibration generating unit 612 will be referred to below with reference to FIGS. 8-11. The vibration generating unit 612 can be seen as a means for generating haptic/tactile/acoustic click feedback to the user.

The drawings show two different implementations of the vibration generating unit 612, seen at 502*a* and 502*b*. Even though both implementations are shown on the same drawings, this will not be the typical situation in an actual implementation of the pointing device 200. Rather, the pointing device 200 will contain either the implementation 502a or the implementation 502b.

The first implementation of the vibration generating unit 612 is a small electric motor 502a, for instance of a type used in mobile phones or similar hand-held devices to generate a vibration. The electric motor 502a is mounted to the printed circuit board 500a at a lateral position with respect to the center section 630 of the hollow rod 12, on the opposite side of the printed circuit board 500a with respect to the laser sensor 602.

When the controller 606 sends the control or drive signal to the electric motor 502a, a shaft 514 thereof (protruding from the motor housing 510, see FIG. 9) will rotate an asymmetrical, semi-circular movable member 512 in a rotational motion 518. The member 512 will interact with a small circuit board or similar element 516 external to the motor housing 510. The element 516 is mounted to or otherwise in contact with the printed circuit board 500a, or alternatively the hollow rod 12 or other appropriate parts of the pointing device 200. When the movable member 512 strikes the element 516, it will giving rise to a vibration and a sound noticeable by the user as a feedback of the click operation just committed. Since the electric motor 502a is contained within the hollow bar 12, it will be operationally protected in a beneficial way. Still, it will be able to generate a desired click feedback sound to the user by generating vibrations when striking the element 516.

In another embodiment, the vibration generating unit 612, 502b may have a movable member 522 which causes the vibration and sound by a reciprocating motion 524 in a linear direction transversal to the direction in which the cursor navigation member 14, or rollerbar 14, is depressible with respect to the base part 212. This arrangement allows for generation of the click feedback in a lateral direction rather than in a direction which is opposite to the depressive click action; hence the user's ability to actuate the rollerbar 14 without potentially disturbing influence from the click feedback will be improved.

In the second implementation referred to above, the vibration generating unit is an electric solenoid 502b, and the movable member is a plunger 522 of the solenoid. See FIG. 9. The plunger 522 of the solenoid 502b may generate the vibration and sound by interacting with the inside of a housing 520 of the solenoid. Alternatively, the plunger 522 of the solenoid 502b may generate the vibration and sound by interacting with an element being external to the housing 520 of the solenoid. In such a case, a part 522b of the plunger 522 which extends outside of the solenoid housing 520 will interact with this external element. The external element may be a vertical plate member or other element 530 attached to the printed circuit board 500a next to the solenoid 522b, or alternatively the hollow rod 12.

The amount of vibration and sound generated by the vibration generating unit 612; 502a, 502b may be configurable by the user. Hence, the user may set the amount of click feedback desired, for instance by using the button set 400. The controller 606 may then actuate the vibration generating unit 612; 502a, 502b with a drive current or signal having a magnitude corresponding to the user setting.

An alternative use of the vibration generating unit 612; 502a, 502b is to give the user audible feedback when scrolling with the scroll wheel 405. To this end, the controller 606 may be configured, in response to detecting actuation of the scroll wheel 405, to send a burst of control or drive signals to the vibration generating unit 612; 502a, 502b, so as to cause generation of intermittent vibrations and a ticking sound and sensation as a feedback to the user of the scroll operation committed by the actuation of the scroll wheel 405.

The non-mechanical click sensor arrangement disclosed above allows for generation of silent clicks, wherein the controller 606—upon determination that the click operation threshold value has been exceeded—will send the control signal to the computer via the interface 608 to indicate that a mouse click operation has occurred, but refrain from sending a control signal to the vibration generating unit 612, 502a, 502b. As a result, no click feedback sound will be given to the user.

More specifically, the controller 606 may be configured, in response to having determined that a mouse click operation is intended by the user's depression, to:

1) determine that a silent click mode is active, for instance by checking a memory 607 setting to determine whether user feedback of mouse click operations is disabled, 2) if silent click mode is active, cause transmission of the data representing the mouse click operation to the computer through the computer interface circuitry 608 but refrain from sending a control or drive signal to the vibration generating unit 612, 502a, 502b to avoid causing generation of a vibration and a sound; and 3) otherwise, if silent click mode is not active, cause transmission of the data representing the mouse click operation to the computer through the computer interface circuitry 608 and send the control or drive signal to the vibration generating unit 612, 502a, 502b to cause generation of the vibration and sound.

Such a silent click mode may be configurable by the user, using for instance the button set 400.

In this way, whether or not an audible click feedback is to be caused will be user configurable in a way which was not possible with a mechanical click switch in the prior art.

The invention has been described above in detail with reference to some possible embodiments thereof. However, as is readily understood by those skilled in the art, other embodiments are equally possible within the scope of the present invention.

The invention claimed is:

1. A pointing device for controlling a computer user interface, the pointing device comprising:
   a housing having a base part;
   an elongate support member;
   an elongate cursor navigation member being movably arranged for rotation about the elongate support member and translation along the elongate support member, the cursor navigation member further being depressible with respect to the base part;
   a plurality of sensors for detecting rotation, translation, and depression of the cursor navigation member;
   computer interface circuitry for connection to a computer;
   a controller connected to the plurality of sensors, the controller being configured to cause transmission of data regarding rotation, translation, and depression of the elongate cursor navigation member to the computer through the computer interface circuitry;
   a button set in or at an upper part of the housing, individual buttons of the button set representing respective mouse-related or other user interface related actions, wherein the controller is configured to monitor the button set to detect a certain first type of user actuation of one or more individual buttons, and in response enter the click sensitivity adjustment mode,
   wherein the plurality of sensors include contactless click sensors for detecting deflection of the support member caused when a user depresses the cursor navigation member, the controller being configured to monitor outputs from the contactless click sensors to detect that the detected deflection of the support member exceeds a click operation threshold value, and in response to such detected deflection, to determine that a mouse click operation is intended by the user's depression and to cause transmission of data representing the mouse click operation to the computer through the computer interface circuitry, and wherein the controller has a click sensitivity adjustment mode for allowing the user to configure the click operation threshold value;

wherein the controller is further configured, in the click sensitivity adjustment mode, to monitor the button set to detect a certain second type of user actuation of one or more individual buttons, and in response determine a selected setting among a plurality of available click sensitivity settings which represent different available values of the click operation threshold value.

2. The pointing device for controlling a computer user interface as claimed in claim 1, the pointing device comprising:

the elongate support member including a hollow rod suspended at its ends to allow certain depression; and a printed circuit board provided inside the hollow rod, and wherein the contactless click sensors are mounted to the printed circuit board, and wherein the plurality of sensors further includes an optical sensor to detect the rotation and translation of the hollow sleeve or cylinder, the optical sensor also being mounted to the printed circuit board.

3. The pointing device as claimed in claim 2, wherein the contactless click sensors are magnetic sensors which are provided inside the hollow rod at positions near or at the ends of the hollow rod.

4. The pointing device for controlling a computer user interface as claimed in claim 1, the pointing device further comprising:

a vibration generating unit connected to the controller;

wherein the controller is configured, in response to having determined that a mouse click operation is intended by the user's depression, to send a control or drive signal to the vibration generating unit to cause generation of a vibration as a feedback to the user of the mouse click operation committed by the depression of the support member.

5. The pointing device as claimed in claim 4, wherein the vibration generating unit is positioned laterally with respect to a center of the support member.

6. The pointing device as claimed in claim 4, wherein an amount of the vibration generated by the vibration generating unit is configurable by the user.

7. The pointing device as claimed in claim 4, wherein the controller is configured, in response to having determined that a mouse click operation is intended by the user's depression, to:

check a memory setting to determine whether user feedback of mouse click operations is disabled;

if so, cause transmission of the data representing the mouse click operation to the computer through the computer interface circuitry but refrain from sending a control or drive signal to the vibration generating unit to avoid causing generation of a vibration and a sound; and otherwise, cause transmission of the data representing the mouse click operation to the computer through the computer interface circuitry and send the control or drive signal to the vibration generating unit to cause generation of the vibration and the sound.

8. The pointing device as claimed in claim 6, wherein the vibration generating unit is configurable by the user using the button set.

9. The pointing device as claimed in claim 1, wherein the certain first type of user actuation is a long-press on one specific individual button.

10. The pointing device as claimed in claim 1, wherein the certain first type of user actuation is a simultaneous press on two specific individual buttons.

11. The pointing device as claimed in claim 1, wherein the certain second type of user actuation is repeated short-presses on one specific individual button.

12. The pointing device as claimed in claim 1, wherein the certain second type of user actuation is a scrolling of a scroll wheel included in the button set.

13. The pointing device as claimed in claim 1, wherein the controller is further configured to store the selected setting in a memory.

14. A pointing device for controlling a computer user interface, the pointing device comprising:

a housing having a base part;

an elongate support member;

an elongate cursor navigation member being movably arranged for rotation about the elongate support member and translation along the elongate support member, the cursor navigation member further being depressible with respect to the base part;

a plurality of sensors for detecting rotation, translation, and depression of the cursor navigation member;

computer interface circuitry for connection to a computer;

a controller connected to the plurality of sensors, the controller being configured to cause transmission of data regarding rotation, translation, and depression of the elongate cursor navigation member to the computer through the computer interface circuitry;

wherein the plurality of sensors include contactless click sensors for detecting deflection of the support member caused when a user depresses the cursor navigation member, the controller being configured to monitor outputs from the contactless click sensors to detect that the detected deflection of the support member exceeds a click operation threshold value, and in response to such detected deflection, to determine that a mouse click operation is intended by the user's depression and to cause transmission of data representing the mouse click operation to the computer through the computer interface circuitry, a vibration generating unit connected to the controller, wherein the vibration generating unit is positioned laterally with respect to a center of the support member;

wherein the controller has a click sensitivity adjustment mode for allowing the user to configure the click operation threshold value;

wherein the controller is configured, in response to having determined that a mouse click operation is intended by the user's depression, to send a control or drive signal to the vibration generating unit to cause generation of a vibration as a feedback to the user of the mouse click operation committed by the depression of the support member;

wherein the vibration generating unit is mounted to the printed circuit board at a lateral position with respect to a center section of the hollow rod.

15. The pointing device as claimed in claim 14, wherein the vibration generating unit has a movable member which causes the vibration and a sound by a reciprocating motion in a direction transversal to the direction in which the cursor navigation member is depressible with respect to the base part.

16. The pointing device as claimed in claim 15, wherein the vibration generating unit is an electric solenoid and the movable member is a plunger of the solenoid.

17. The pointing device as claimed in claim 16, wherein the plunger of the solenoid generates the vibration and the sound by interacting with a housing of the solenoid.

18. The pointing device as claimed in claim 16, wherein the plunger of the solenoid generates the vibration and the sound by interacting with an element being external to the housing of the solenoid, the element being one of:
   an element mounted to the printed circuit board, and the hollow rod.

19. The pointing device as claimed in claim 14, wherein the vibration generating unit has a movable member which causes the vibration and a sound by a rotational motion which strikes an element being external to the vibration generating unit, the element being one of an element mounted to the printed circuit board, and the hollow rod.

20. The pointing device as claimed in claim 19, wherein the vibration generating unit is an electric motor and the movable member is an asymmetrical member mounted to a shaft of the electric motor.

21. A pointing device for controlling a computer user interface, the pointing device comprising:
   a housing having a base part;
   an elongate support member;
   an elongate cursor navigation member being movably arranged for rotation about the elongate support member and translation along the elongate support member, the cursor navigation member further being depressible with respect to the base part;
   a plurality of sensors for detecting rotation, translation, and depression of the cursor navigation member;
   computer interface circuitry for connection to a computer;
   a controller connected to the plurality of sensors, the controller being configured to cause transmission of data regarding rotation, translation, and depression of the elongate cursor navigation member to the computer through the computer interface circuitry;
   wherein the plurality of sensors include contactless click sensors for detecting deflection of the support member caused when a user depresses the cursor navigation member, the controller being configured to monitor outputs from the contactless click sensors to detect that the detected deflection of the support member exceeds a click operation threshold value, and in response to such detected deflection, to determine that a mouse click operation is intended by the user's depression and to cause transmission of data representing the mouse click operation to the computer through the computer interface circuitry,
   a vibration generating unit connected to the controller, wherein an amount of vibration generated by the vibration generating unit is configurable by the user;
   a button set, wherein a magnitude of the control or drive signal to the vibration generating unit is configurable by the user using the button set;
   wherein the controller has a click sensitivity adjustment mode for allowing the user to configure the click operation threshold value;
   wherein the controller is configured, in response to having determined that a mouse click operation is intended by the user's depression, to send a control or drive signal to the vibration generating unit to cause generation of a vibration as a feedback to the user of the mouse click operation committed by the depression of the support member;
   wherein the button set includes a scroll wheel, and
   wherein the controller is configured, in response to detecting actuation of the scroll wheel, to send a burst of control or drive signals to the vibration generating unit to cause generation of intermittent vibrations and a ticking sound as a feedback to the user of a scroll operation committed by the actuation of the scroll wheel.

* * * * *